US00RE46636E

(19) United States
(12) Reissued Patent
Sumino et al.

(10) Patent Number: US RE46,636 E
(45) Date of Reissued Patent: Dec. 12, 2017

(54) NONVOLATILE MEMORY DEVICE, NONVOLATILE MEMORY DEVICE GROUP, AND MANUFACTURING METHOD THEREOF

(71) Applicant: Sony Corporation, Tokyo (JP)

(72) Inventors: Jun Sumino, Kanagawa (JP); Motonari Honda, Kanagawa (JP)

(73) Assignee: SONY CORPORATION, Tokyo (JP)

(21) Appl. No.: 14/836,418

(22) Filed: Aug. 26, 2015

Related U.S. Patent Documents

Reissue of:
(64) Patent No.: 8,519,377
Issued: Aug. 27, 2013
Appl. No.: 13/252,643
Filed: Oct. 4, 2011

(30) Foreign Application Priority Data

Oct. 13, 2010 (JP) ..... 2010-230170

(51) Int. Cl.
*H01L 29/06* (2006.01)
*H01L 21/20* (2006.01)
(Continued)

(52) U.S. Cl.
CPC ..... *H01L 45/1246* (2013.01); *H01L 27/228* (2013.01); *H01L 27/2436* (2013.01); *H01L 27/2472* (2013.01); *H01L 43/08* (2013.01); *H01L 43/10* (2013.01); *H01L 45/06* (2013.01); *H01L 45/085* (2013.01); *H01L 45/122* (2013.01); *H01L 45/1206* (2013.01);
(Continued)

(58) Field of Classification Search
CPC ..... H01L 45/122; H01L 45/1226; H01L 45/1253; H01L 45/1683; H01L 27/2472; H01L 27/2463
See application file for complete search history.

(56) References Cited

U.S. PATENT DOCUMENTS

2004/0248339 A1* 12/2004 Lung ..... H01L 45/06 438/102
2010/0176365 A1* 7/2010 Park et al. ..... 257/3

FOREIGN PATENT DOCUMENTS

JP 2006-179778 7/2006
JP 2008-153375 7/2008
JP 2010-212541 9/2010

OTHER PUBLICATIONS

Zhang, Weili, et al., "Electrical Conductivity of Nitride Carbon Films with Different Nitrogen Content", Solid State Communications, vol. 126, pp. 163-166, 2003.

(Continued)

*Primary Examiner* — James Menefee
(74) *Attorney, Agent, or Firm* — Dentons US LLP

(57) ABSTRACT

A nonvolatile memory device group includes: (A) a first insulating layer; (B) a second insulating layer that has a first concavity and a second concavity communicating with the first concavity and having a width larger than that of the first concavity and that is disposed on the first insulating layer; (C) a plurality of electrodes that are disposed in the first insulating layer and the top surface of which is exposed from the bottom surface of the first concavity; (D) an information storage layer that is formed on the side walls and the bottom surfaces of the first concavity and the second concavity; and (E) a conductive material layer that is filled in a space surrounded with the information storage layer in the second concavity.

14 Claims, 9 Drawing Sheets

(51) Int. Cl.

| | |
|---|---|
| ***H01L 45/00*** | (2006.01) |
| ***H01L 27/22*** | (2006.01) |
| ***H01L 27/24*** | (2006.01) |
| ***H01L 43/08*** | (2006.01) |
| ***H01L 43/10*** | (2006.01) |

(52) U.S. Cl.

CPC ..... *H01L 45/1226* (2013.01); *H01L 45/1266* (2013.01); *H01L 45/142* (2013.01); *H01L 45/143* (2013.01); *H01L 45/144* (2013.01); *H01L 45/146* (2013.01); *H01L 45/147* (2013.01); *H01L 45/16* (2013.01); *H01L 45/1683* (2013.01)

(56) References Cited

OTHER PUBLICATIONS

Zhang, et al. "Electrical conductivity of nitride carbon films with different nitrogen content", Solid State Communications, vol. 126, pp. 163-166 Oct. 2003.*

* cited by examiner

NONVOLATILE MEMORY DEVICE, NONVOLATILE MEMORY DEVICE GROUP, AND MANUFACTURING METHOD THEREOF

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

FIELD

The present disclosure relates to a nonvolatile memory device, a nonvolatile memory device group, and a manufacturing method thereof.

BACKGROUND

Currently, a semiconductor device having nonvolatile memory cells, such as an EEPROM (Electrically Erasable and Programmable ROM) or a flash memory, is generally used in diverse fields. The number of rewrites thereon, improvement of reliability such as data retention tolerance, and miniaturization of the structure are important subjects. On the other hand, a flash memory that is represented as a floating type that is in the marketplace has recently attracted attention since it is said that a resistance change nonvolatile memory device has a high reliability in addition to a simple structure, a high-speed rewrite function, and multi-value technology, and is suitable for high performance and high integration.

Since a nonvolatile memory device including a phase change RAM (PRAM) has a structure in which a resistance change layer that functions as a memory portion is arranged between two electrodes, the memory structure is simple, and easy miniaturization is possible. A nonvolatile memory device in which the resistance change layer is formed of an ionic conductor including metal is disclosed, for example, in JP-A-2008-153375. A nonvolatile memory device including a chalcogenide film is disclosed, for example, in JP-A-2006-179778.

SUMMARY

However, in the nonvolatile memory device disclosed in JP-A-2008-153375, a first electrode is disposed in each nonvolatile memory device. On the other hand, by using a storage layer and a second electrode in common to plural nonvolatile memory devices and defining the composition of the storage layer, it is possible to avoid the lessening of patterning precision and the peeling of a film in the device structure. However, it is difficult to completely prevent the storage layer from being damaged due to the patterning process and the composition of the storage layer is restricted. In the nonvolatile memory device disclosed in JP-A-2006-179778, two processes of forming the storage layer by burying a chalcogenide phase change material in a hole formed in an insulating film in each nonvolatile memory device and then forming an upper electrode are necessary, thereby complicating the manufacturing procedure.

Accordingly, it is desirable to provide a nonvolatile memory device and a nonvolatile memory device group which can avoid the damage to an information storage layer and the peeling of a film in a device structure and simplify the manufacturing procedure thereof, and a manufacturing method thereof.

One embodiment of the present disclosure is directed to a nonvolatile memory device group including: (A) a first insulating layer; (B) a second insulating layer that has a first concavity and a second concavity communicating with the first concavity and having a width larger than that of the first concavity and that is disposed on the first insulating layer; (C) a plurality of electrodes that are disposed in the first insulating layer and the top surface of which is exposed from the bottom surface of the first concavity; (D) an information storage layer that is formed on the side walls and the bottom surfaces of the first concavity and the second concavity; and (E) a conductive material layer that is filled in a space surrounded with the information storage layer in the second concavity.

Another embodiment of the present disclosure is directed to a nonvolatile memory device group including: (A) a first insulating layer; (B) a second insulating layer that has a concavity and that is disposed on the first insulating layer; (C) a plurality of electrodes that are disposed in the first insulating layer and the top surface of which is exposed from the bottom surface of the concavity; (D) an information storage layer that is formed on the side wall and the bottom surface of the concavity; and (E) a conductive material layer that is filled in a space surrounded with the information storage layer in the concavity.

Still another embodiment of the present disclosure is directed to a nonvolatile memory device including: (A) a first insulating layer; (B) a second insulating layer that has a concavity and that is disposed on the first insulating layer; (C) an electrode that is disposed in the first insulating layer and the top surface of which is exposed from the bottom surface of the concavity; (D) an information storage layer that is formed on the side wall and the bottom surface of the concavity; and (E) a conductive material layer that is filled in a space surrounded with the information storage layer in the concavity.

Yet another embodiment of the present disclosure is directed to a method of manufacturing a nonvolatile memory device group, including: (a) forming a plurality of electrodes, the top surface of which is flush with the top surface of a first insulating layer, in the first insulating layer; (b) forming a second insulating layer on the first insulating layer and then forming a first concavity exposing the electrodes from the bottom surface thereof and a second concavity communicating with the first concavity and having a width larger than that of the first concavity in the second insulating layer; (c) forming an information storage layer on the top surface of the second insulating layer and the side walls and the bottom surfaces of the first concavity and the second concavity; (d) forming a conductive material layer on the entire surface; and (e) removing the conductive material layer and the information storage layer on the top surface of the second insulating layer to acquire the first concavity having the information storage layer buried therein and the second concavity having the information storage layer and the conductive material layer buried therein.

Still yet another embodiment of the present disclosure is directed to a method of manufacturing a nonvolatile memory device group, including: (a) forming a plurality of electrodes, the top surface of which is flush with the top surface of a first insulating layer, in the first insulating layer; (b) forming a second insulating layer on the first insulating layer and then forming a concavity exposing the electrodes from the bottom surface thereof in the second insulating layer; (c)

forming an information storage layer on the top surface of the second insulating layer and the side wall and the bottom surface of the concavity; (d) forming a conductive material layer on the entire surface; and (e) removing the conductive material layer and the information storage layer on the top surface of the second insulating layer to acquire a wiring formed by the conductive material layer filled in a space surrounded with the information storage layer in the concavity.

Further another embodiment of the present disclosure is directed to a method of manufacturing a nonvolatile memory device including: (a) forming an electrode, the top surface of which is flush with the top surface of a first insulating layer, in the first insulating layer; (b) forming a second insulating layer on the first insulating layer and then forming a concavity exposing the electrodes from the bottom surface thereof in the second insulating layer; (c) forming an information storage layer on the top surface of the second insulating layer and the side wall and the bottom surface of the concavity; (d) forming a conductive material layer on the entire surface; and (e) removing the conductive material layer and the information storage layer on the top surface of the second insulating layer to acquire the conductive material layer filled in a space surrounded with the information storage layer in the concavity.

In the nonvolatile memory device, the nonvolatile memory device group, and the manufacturing methods thereof according to the above-mentioned embodiments of the present disclosure, the nonvolatile memory device and the nonvolatile memory device group have a so-called damascene structure. Accordingly, since it is not necessary to pattern the information storage layer by the use of an etching method, it is possible to avoid the damage on the information storage layer due to the patterning. In addition. since the device structure is formed in the concavity, it is possible to avoid the peeling of a film. It is also possible to simplify the manufacturing procedure.

BRIEF DESCRIPTION OF THE DRAWINGS

FIG. 6A is a partial sectional view which is the same as a sectional view taken along arrow A-A of FIG. 1B, FIG. 6B is a partial plan view which is the same as FIG. 1B, and FIG. 6C is a partial sectional view which is the same as a sectional view taken along arrow C-C of FIG. 1B.

FIG. 7A is a partial sectional view which is the same as a sectional view taken along arrow A-A of FIG. 1B, FIG. 7B is a partial plan view which is the same as FIG. 1B, and FIG. 7C is a partial sectional view which is the same as a sectional view taken along arrow C-C of FIG. 1B.

FIG. 8A is a partial sectional view which is the same as a sectional view taken along arrow A-A of FIG. 5B, FIG. 8B is a partial plan view which is the same as FIG. 5B, and FIG. 8C is a partial sectional view which is the same as a sectional view taken along arrow C-C of FIG. 5B.

FIG. 9A is a partial sectional view which is the same as a sectional view taken along arrow A-A of FIG. 5B, FIG. 9B is a partial plan view which is the same as FIG. 5B, and FIG. 9C is a partial sectional view which is the same as a sectional view taken along arrow C-C of FIG. 5B.

DETAILED DESCRIPTION

Figure 1A:
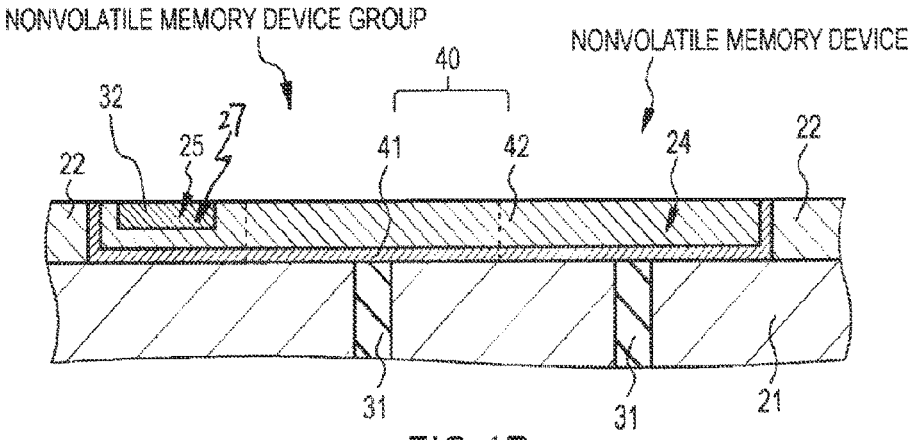
FIGS. 1A, 1B, and 1C are a schematic partial sectional view, a partial plan view, and a schematic partial sectional view of a nonvolatile memory device group according to embodiment 1 of the present disclosure, respectively.

Hereinafter, with reference to the accompanying drawings, embodiments of the present disclosure will be described. However, the present disclosure is not limited to the embodiment, and diverse numeral values and materials in the embodiment are exemplary. The explanation thereof will be made in the following order.

1. General Explanation of Nonvolatile Memory device, Nonvolatile Memory device Group, and Manufacturing Methods Thereof
2. Embodiment 1 (nonvolatile memory device group and manufacturing method thereof according to embodiment 1)
3. Embodiment 2 (modification of embodiment 1)
4. Embodiment 3 (another modification of embodiment 1)
5. Embodiment 4 (nonvolatile memory device group and manufacturing method thereof according to embodiment 2) and others

[Nonvolatile Memory Device and Manufacturing Method Thereof According to Embodiment of the Present Disclosure, and General Explanations Thereof]

In a nonvolatile memory device group and a manufacturing method thereof according to embodiment 1 or 2 of the present disclosure, N electrodes are disposed, a nonvolatile memory device is formed by an electrode, an information storage layer, and a conductive material layer (or a wiring), and the nonvolatile memory device group includes N nonvolatile memory devices.

In the nonvolatile memory device group or the manufacturing method according to embodiment 1 of the present disclosure, a third insulating layer may be formed on the entire surface, and a wiring connected to the conductive material layer via a contact plug may be formed on the third insulating layer. Alternatively, a concavity connecting portion connecting the second concavities of the neighboring nonvolatile memory device groups to each other may be disposed in the second insulating layer, an information storage layer extension may be formed on the side wall and the bottom surface of the concavity connecting portion, a space surrounded by the information storage layer extension in the concavity connection portion may be filled with a conductive material layer extension, and a wiring may be formed by the conductive material layer and the conductive material layer extension filled in the second concavity and the concavity connecting portion.

In the nonvolatile memory device group or the manufacturing method thereof according to embodiment 1 or 2 of the present disclosure and the nonvolatile memory device and the manufacturing method thereof according to the embodiment of the present disclosure, the information storage layer may include a resistance change layer that stores information as its electrical resistance value (hereinafter, simply referred to as "resistance value") is changed. That is, the nonvolatile memory device may be configured as a resistance change nonvolatile memory device. In this case, the resistance change layer may be formed of an ionic conductor that includes metal, or may be formed of a chalcogenide material. Further, the resistance change layer may be formed of a material having a colossal electro-resistance effect (CER effect). Alternatively, the nonvolatile memory device may be configured by a phase change memory device (PRAM) or a PMC (Programmable metallization Cell), which operates as a memory device using the phenomenon that the phase change material forming the resistance change layer varies by several digits of electrical resistance value between an amorphous state and a crystallized state. Here, when the resistance change layer is formed of an ionic conductor including metal, the resistance change layer may have a laminated structure of a high resistance layer and an ion source layer. In this case, for example, the ion source layer may contain at least one kind of element (chalcogen) (atom) selected from the group consisting of tellurium (Te), sulfur (S), and selenium (Se) and at least one kind of element (atom) selected from the group consisting of copper (Cu), zirconium (Zr), and aluminum (Al) and the resistance of the high resistance layer may be lowered by causing the at least one kind of element (atom) selected from the group consisting of copper (Cu), zirconium (Zr), and aluminum (Al) to diffuse into the high resistance layer when a predetermined voltage is applied to the corresponding memory device. The high resistance layer is in contact with the electrodes.

In the method of manufacturing the nonvolatile memory device group according to embodiment 1 of the present disclosure having the above-mentioned configuration, a third insulating layer may be formed on the entire surface subsequently to the (e) and a wiring connected to the conductive material layer via a contact plug may be formed on the third insulating layer. Alternatively, a concavity connecting portion that connects the second concavities in the neighboring nonvolatile memory device groups to each other may be formed in the second insulating layer in the (b); an information storage layer extension may be formed on the side wall and the bottom surface of the concavity connecting portion in the (c); the conductive material layer and the information storage layer on the second insulating layer may be removed in the (e) to acquire the first concavity having the information storage layer buried therein, the second concavity having the information storage layer and the conductive material layer buried therein, and the concavity connecting portion having the information storage layer and the conductive material layer extension buried therein, and a wiring may be formed by the conductive material layer and the conductive material layer extension filled in the second concavity and the concavity connecting portion.

In the nonvolatile memory device group or the manufacturing method according to embodiment 1 or 2 of the present disclosure and the nonvolatile memory device and the manufacturing method according to the present disclosure having the above-mentioned configuration (hereinafter, also generically referred to as the "present disclosure"), when the resistance change layer is formed of an ionic conductor including metal, the resistance change layer may be constructed by a conductive or semi-conductive thin film (for example, a thin film formed of GeSbTe, GeTe, GeSe, GeS, SiGeTe, or SiGeSbTe or a laminated structure of the thin film and a thin film formed of, for example, Ag, Ag alloy, Cu, Cu alloy, Zn, or Zn alloy) containing at least one kind of element (atom) selected from the group consisting of copper (Cu), silver (Ag), and zinc (Zn) and at east one kind of element (chalcogen) (atom) selected from the group consisting of tellurium (Te), sulfur (S), and selenium (Se). Alternatively, a film (rare-earth oxide film) formed of oxide of at least one rare-earth element selected from the group consisting of La, Ce, Pr, Nd, Sm, Eu, Gd, Tb, Dy, Ho, Er, Yb, and Y or an oxide film of Hf, Ta, W, or the like may be formed in the entire layer or in a part in the thickness direction.

Further, in the case where the resistance change layer has a multilayer structure of the high resistance layer and the ionic source layer, the high resistance layer includes tellurium (Te) in the largest quantity as an anion component, and the ionic source layer includes at least one kind of metallic element as a positively ionizable element, and includes at least one kind of element (chalcogen) (atom) selected from the group consisting of tellurium (Te), sulfur (S), and selenium (Se) as a negatively ionizable element. The metallic element and the chalcogen are combined to form a metallic chalcogenide layer (chalcogenide material layer). The metallic calcogenide layer mainly has an amorphous structure, and serves as an ion source. The ionic source layer is formed to have a resistance value that is smaller than that of the high resistance layer in an initial state or in an erased state. In this case, the high resistance layer may have a single layer structure or a multi layer structure, and in this case, the lower layer thereof that includes tellurium in the largest quantity as an anion component is in contact with the electrode, and the upper layer thereof includes an element as an anion component except for tellurium.

It is preferable that the metallic element that forms the metallic chalcogenide layer is a chemically stable element that can exist in a metallic state in the ionic source layer that includes the above-described chalcogen so as to form a conduction path (filament) in the metallic state at the time of performing a writing operation, and such metallic elements may be transition metals in groups 4A, 5A, and 6A in the periodic table, that is, Ti (titanium), Zr (zirconium), Hf (hafnium), V (Vanadium), Nb (Niobium), Ta (tantalum), Cr (chromium), Mo (Molybdenum), and W (tungsten). One kind or two kinds or more of these elements may be used to form the metallic chalcogenide layer. Further, Al (aluminum), Cu (copper), Ge (germanium), and Si (silicon) may be added to the ionic source layer.

Specific constituent materials of the ionic source layer, for example, may be ZrTeAl, TiTeAl, CrTeAl, WTeAl, and TaTeAl. Further examples, are ZrTeAl, CuZrTeAl with added Cu, CuZrTeAlGe with additional Ge, or CuZrTeAl-SiGe with additional Si as an additional element may be included. Further, ZrTeMg that uses Mg instead of Al may be included. Even in the case of selecting another transition element such as titanium (Ti), tantalum (Ta), or the like, instead of zirconium (Zr), as the metallic element that forms the metallic chalcogenide layer, it is possible to use the same additional element, and a concrete constituent material of the ionic source layer, for example, TaTeAlGe or the like may be included. Further, in addition to tellurium (Te), Sulfur (S), selenium (Se), iodine (I), or the like may be used, and as the concrete constituent material of the ionic source layer, ZrSAl, ZrSeAl, or ZeIAl may be included.

Further, by constituting the metallic element that forms the metallic chalcogenide layer as a metallic element (M) that is easy to react on tellurium (Te) that is included in the high resistance layer, a stabilized structure so called a M.Te/ionic source layer can be obtained by heating the laminated structure so called a Te/ionic source layer (including metallic element M) after thin film forming. Here, as the metallic element (M) that is easy to react on tellurium (Te), for example, aluminum (Al) or magnesium (Mg) may be used.

The high resistance layer has a function as a barrier on the electrical conductivity, and when a predetermined voltage is applied between the electrode and the conductive material layer (or the wiring), the high resistance layer shows a higher resistance value than the ionic source layer. The high resistance layer, for example, includes a layer which includes a compound that is mainly composed of tellurium (Te) that behaves as an anion component. Concretely, such a compound may be, for example, AlTe, MgTe, ZnTe, or the like. In the composition of the compound that contains tellurium (Te), for example, it is preferable that the content of aluminum (Al) in AlTe is equal to or larger than 20 atom % and equal to or smaller than 60 atom %. Further, the high resistance layer may include an oxide such as aluminum oxide ($A_2O_3$). Further, it is preferable that the initial resistance value of the high resistance layer is equal to or larger than 1 MΩ, and the resistance value in the low resistance state is equal to or smaller than several hundreds of kΩ. That is, the nonvolatile memory device according to the embodiment of the present disclosure stores information by changing the resistance value of the high resistance layer. In order to read the resistance state of the miniaturized nonvolatile memory device at high speed, it is preferable to lower the resistance value in a low resistance state as far as possible. However, since the resistance value is 40 kΩ to 100 kΩ in the case of writing information (data) on conditions of 20 μA to 50 μA, 2 V, it is prerequisited that the initial resistance value of the nonvolatile memory device is higher than this value. Further, in consideration of the resistance separation width of a single-digit range, it is considered that the above-described resistance value is appropriate.

Here, if it is assumed that tellurium (Te) is contained in the largest quantity in the high resistance layer as an anion component, the metallic element that is diffused onto the high resistance layer is stabilized while the high resistance layer is in a low resistance state, and it becomes easy to hold the low resistance state. On the other hand, since the tellurium (Te) forms a weak bond with the metallic element in comparison to the oxide or silicon compound, and thus the metallic element that is diffused into the high resistance layer is easy to move to the ionic source layer, the erasing property is improved. That is, the retention property of the written data in the low resistance state is improved, and low voltage retention during data erasing becomes possible. Further, with respect to a large number of write/erase operations, it is possible to reduce a difference in resistance value in the erased state. At this time, in general, since the absolute value of the electronegativity becomes larger in the order of tellurium<selenium<sulfur<oxygen in the chalcogenide compound, the improvement effect is heightened as oxygen becomes lower in the high resistance layer and the chalcogenide having low electronegativity is used.

A material that forms the electrode may be, for example, W (tungsten), WN (tungsten nitride), Cu (copper), Al (aluminum), Mo (molybdenum), Au (gold), Pt (platinum), Ti (titanium), TiN (titanium nitride), TiW (tungsten titanate), Mo (molybdenum), Ta (tantalum), and silicide. In the case where the electrode is formed of a material that has a possibility of ion conduction in the electric field, such as copper (Cu), the surface of the electrode may be covered with a material in which ion conduction or heat diffusion is difficult, such as tungsten (W), tungsten nitride (WN), titanium nitride (TiN), and tantalum nitride (TaN). When the ion source layer contains Al (aluminum), examples of the constituent material of the electrode include a metal film containing at least one kind of material ionized less than Al (aluminum), for example, a metal thin film including at least one kind of Cr (chrome), W (tungsten), Co (cobalt), Si (silicon), Au (gold), Pd (palladium), Mo (molybdenum), Ir (iridium), and Ti (titanium), or their oxide film or nitride film. The conductive material layer (or the wiring) can be formed of known conductive materials including the same conductive material as the electrode. Alternatively, a laminated structure of an underlying layer formed of Cr or Ti and a Cu layer, an Au layer, or a Pt layer formed thereon may be used. Further, the conductive material layer may be constructed to have a single layer of Ta and the like or a multilayer structure of Cu, Ti and the like. The electrode and the conductive material layer (or the wiring) can be formed, for example, using a PVD method such as a sputtering method and a CVD method.

At the time of storing (writing) information, a "positive direction" (for example, the high resistance layer has a negative potential, and the ionic source layer side has a positive potential) voltage pulse is applied to the nonvolatile memory device in an initial state (high resistance state). As a result, the metal element contained in the ion source layer is ionized to diffuse into the high resistance layer, the ions are combined with electrons in the electrode to precipitate or the ions stay in the high-resistance layer to form an impurity level. Accordingly, a conduction path including the metal element is formed in the information storage layer, more specifically, in the high resistance layer and thus the resistance of the information storage layer is lowered (information stored state). Thereafter, even when the application of the voltage to the nonvolatile memory device is stopped, the information storage layer is retained in the low-resistance state. Accordingly, information is written and retained. In the case of using a storage device that can be written only once, so called a PROM (Programmable Read Only Memory), information recording is completed by this information recording process. In the case of application to a storage device in which information can be rewritten multiple times, that is, a RAM (Random Access Memory) or EEPROM, a rewritable process is necessary. In the case of rewriting information, a "negative direction" (for example, the high resistance layer has a positive potential, and the ionic source layer side has a negative potential) voltage pulse is applied to the nonvolatile memory device in a low resistance state. As a result, the metal element precipitating in the electrode is ionized and melted into the ion source layer. Accordingly, the conduction path including the metal element disappears and the resistance of the information storage layer is heightened (initial state or erased state). Thereafter, even when the application of the voltage to the nonvolatile memory device is stopped, the information storage layer is retained in a high resistance state. Accordingly, the written information is erased. By repeating this process, writing of information on the nonvolatile memory device and the erasing of the written information can be repeatedly performed. In reading the information stored in the nonvolatile memory device, for example, the "positive direction" (for example, the high resistance layer has a negative potential, and the ionic source side has a positive potential) voltage is applied, but the value is lower than the voltage value that is applied when the information is stored (written). For example, by making the high resistance state and the low resistance state correspond to information "0" and information "1", respectively, the information is changed from "0" to "1" in the information writing process, and the information is changed from "1" to "0" in the information erasing process. In this case, the operation for the low resistance state and the operation for the high resistance state correspond to the write operation and the erase operation, respectively. However, the resistance states which are opposite to the above-described states may correspond to the erase operation and the write operation.

In the case of forming the resistance change layer with a chalcogenide material, the chalcogenide material may be a metal such as GeSbTe, ZnSe, or GaSnTe and a compound such as Se or Te. Further, in the case of forming the resistance change layer with a material having the colossal electroresistance effect (CER effect), a related material may be a ternary perovskite phase type transition metal oxide ($PrCaMnO_3$ or $SrTiO_3$), or a binary transition metal oxide (CiO, NiO, CuO, $TiO_2$, or $Fe_3O_4$).

Further, the nonvolatile memory device may be formed of a nonvolatile magnetic memory device having a magnetoresistive effect. Specifically, such a nonvolatile memory device may be a current field inversion type tunnel magnetoresistive effect device (MRAM) or spin magnetoresistive effect device (spin SRAM) applying magnetization inversion by spin injection. In the latter, in-plane magnetization and perpendicular magnetization are included.

A selection transistor constructed by a field effect transistor (FET) is additionally disposed below the electrode. For example, the direction in which the conductive material layer (or the wiring) serving as a bit line extends can be set to be perpendicular to the direction in which the gate electrode of the field effect transistor extends, but the direction is not limited to this setting. The projective image in the direction in which the conductive material layer (or the wiring) extends may be set to be parallel to the projective image in the direction in which the gate electrode of the field effect transistor extends. In some cases, the selection transistor is not necessary. When the selection transistor constructed by the field effect transistor is additionally disposed below the electrode in this way, a more specific configuration, to which the present disclosure is not limited, including a selection transistor formed on a semiconductor substrate, a first insulating layer covering the selection transistor, and an electrode electrically connected to the selection transistor, or an electrode electrically connected to the selection transistor via a contact hole (or a contact hole, a landing pad, and a lower wiring) disposed in the first insulating layer.

The selection transistor can be constructed, for example, by a known MIS type FET or an MOS type FET. The connection hole for electrically connecting the electrode and the selection transistor may be made of a polysilicon doped with impurities, a high melting metal or metal silicide, such as tungsten, Ti, Pt, Pd, Cu, TiW, TiNW, $WSi_2$, and $MoSi_2$ and may be formed based on a CVD method or a PVD method such as a sputtering method. Examples of the constituent material of the first insulating layer, the second insulating layer, and the third insulating layer include silicon oxide ($SiO_2$), silicon nitride (SiN), SiON, SOG, NSG, BPSG, PSG, BSG, and LTO.

Embodiment 1

Figure 1B:
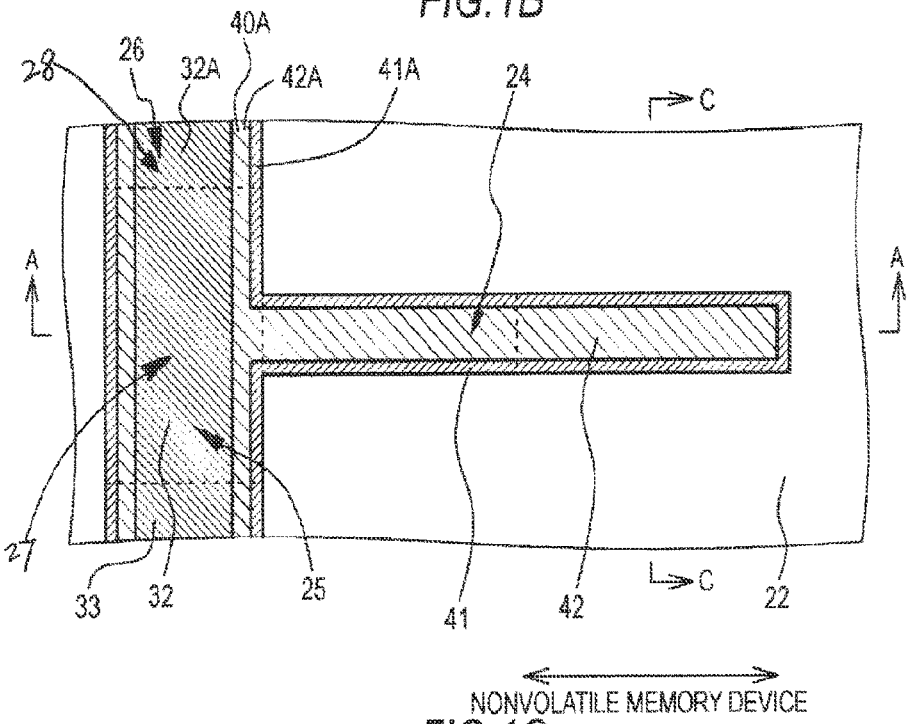
Figure 1C:
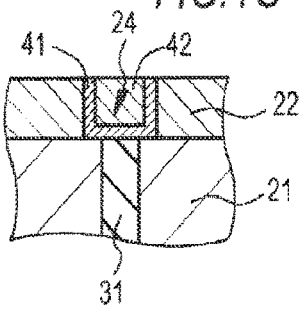
Figure 2:
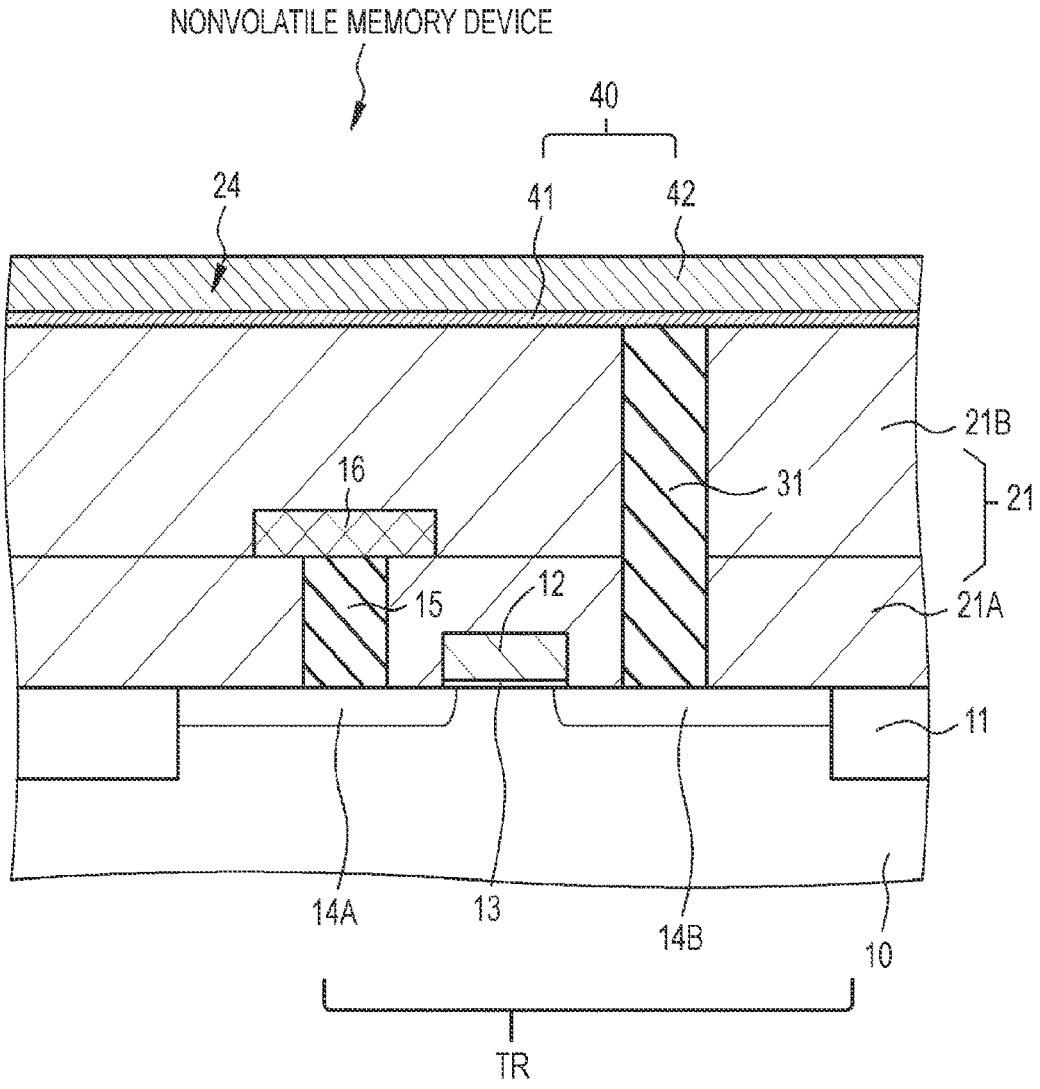
FIG. 2 is a schematic partial sectional view of a nonvolatile memory device constituting the nonvolatile memory device group according to embodiment 1 of the present disclosure.
Figure 3A:
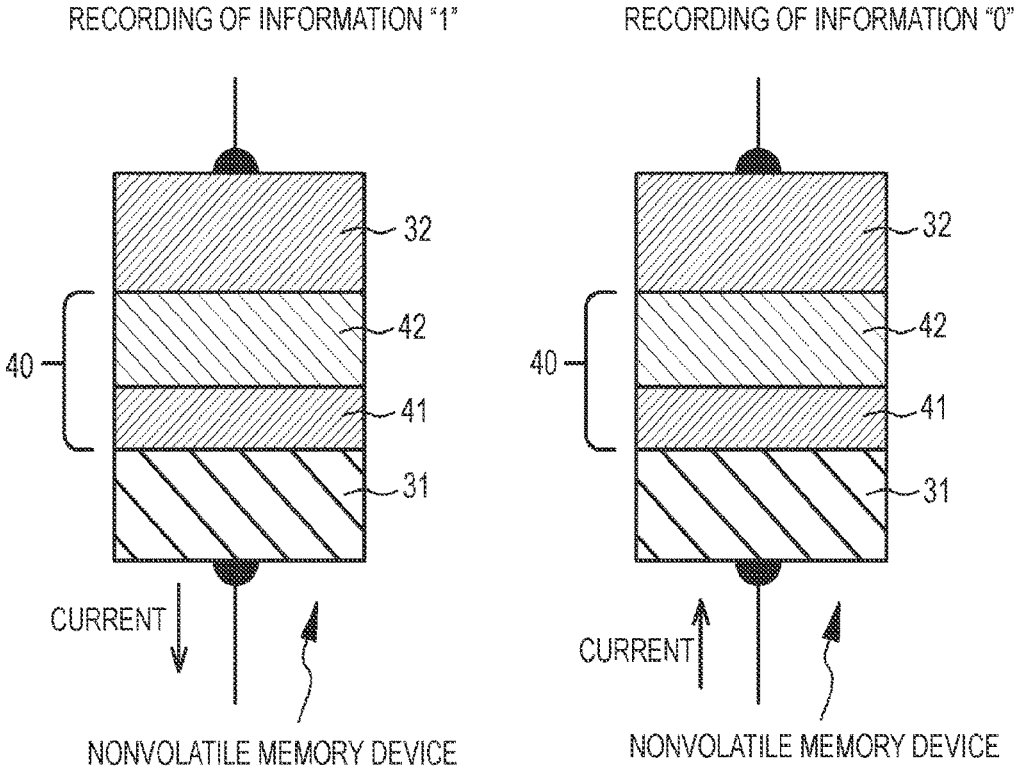
FIGS. 3A and 3B are a diagram and an equivalent circuit diagram conceptually illustrating a nonvolatile memory device group according to embodiment 1 of the present disclosure, respectively.
Figure 3B:
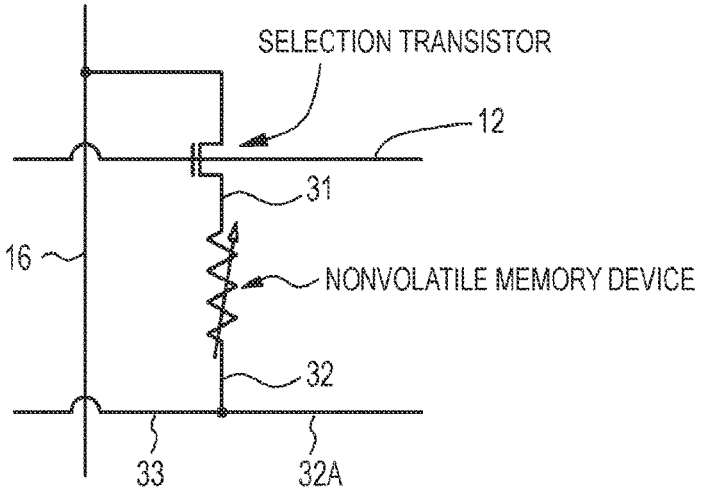

Embodiment 1 provides the nonvolatile memory device group and the manufacturing method thereof according to embodiment 1 of the present disclosure. The schematic partial sectional view, the partial plan view, and the schematic partial sectional view of the nonvolatile memory device group according to embodiment 1 are shown in FIGS. 1A, 1B, and 1C, respectively. The schematic partial sectional view shown in FIG. 1A is a partial sectional view taken along arrow A-A of FIG. 1B and the schematic partial sectional view shown in FIG. 1C is a partial sectional view taken along arrow C-C of FIG. 1B. The schematic partial sectional view of a nonvolatile memory device constituting the nonvolatile memory device group according to embodiment 1 is shown in FIG. 2, the nonvolatile memory device according to embodiment 1 is conceptually shown in FIG. 3A, and the equivalent circuit diagram of one nonvolatile memory device is shown in FIG. 3B. In FIG. 1B, FIG. 4B, FIG. 5B, FIG. 7B, and FIG. 9B, the information storage layer and the like are hatched so as to clarify the constituent components.

The nonvolatile memory device group according to embodiment 1 includes (A) a first insulating layer 21, (B) a second insulating layer 22 that has a first concavity 24 and a second concavity 25 communicating the first concavity 24 and having a width larger than that of the first concavity 24 and that is disposed on the first insulating layer 21, (C) plural electrodes (lower electrodes) 31 that are disposed in the first insulating layer 21 and the top surface of which is exposed from the bottom surface of the first concavity 24, (D) an information storage layer 40 that is formed on the side walls and the bottom surfaces of the first concavity 24 and the second concavity 25, and (E) a conductive material layer 32 that is filled in a space 27 surrounded with the information storage layer 40 in the second concavity 25.

In embodiment 1, N (where N=2 is set in the shown example but N is not limited to the numerical value) electrodes 31 are provided, a nonvolatile memory device is constructed by the electrode 31, the information storage layer 40, and the conductive material layer 32, and N nonvolatile memory devices constitute the nonvolatile memory device group. In the N nonvolatile memory devices, the information storage layer 40 and the conductive material layer 32 are common. The boundaries of the nonvolatile memory devices and the boundary of the nonvolatile memory device group are marked by dotted lines.

In embodiment 1, the information storage layer 40 includes a resistance change layer that stores information by a change in electrical resistance. That is, the nonvolatile memory device according to embodiment 1 is a resistance-changing nonvolatile memory device. The resistance change layer includes an ionic conductor containing metal. More specifically, the resistance change layer has a laminated structure of a high resistance layer 41 and an ion source layer 42. The high resistance layer 41 is in contact with the electrodes 31.

In embodiment 1, a concavity connecting portion 26 connecting the second concavities 25 of the neighboring nonvolatile memory device groups to each other is disposed in the second insulating layer 22. An information storage layer extension 40A is formed on the side wall and the bottom surface of the concavity connecting portion 26. A space 28 surrounded with the information storage layer extension 40A in the concavity connection portion 26 is filled with a conductive material layer extension 32A. A wiring (bit line) 33 is formed by the conductive material layer 32 and the conductive material layer extension 32A filled in the second concavity 25 and the concavity connecting portion 26.

A selection transistor TR constructed by a field effect transistor is disposed below the electrode 31. The direction in which the wiring (bit line) 33 extends is perpendicular to the direction in which a gate electrode 12 (serving as a so-called word line) of the field effect transistor extends. Specifically, the selection transistor TR is formed in a part of a silicon semiconductor substrate 10 surrounded by an isolation region 11 and is covered with the first insulating layer 21. One source/drain region 14B is formed of a tungsten plug and is connected to the information storage layer 40 via the electrode 31 also serving as a contact hole. The other source/drain region 14A is connected to a sense line 16 via the tungsten plug 15. In the drawings, reference numeral 13 represents a gate insulating film.

The ion source layer 42 is formed of a conductive or semiconductive thin film (for example, a laminated structure of a thin film formed of GeSbTe, GeTe, GeSe, GeS, SiGeTe, or SiGeSbTe or a laminated structure of the thin film and a thin film formed of, for example, Ag, Ag alloy, Cu, Cu alloy, Zn, or Zn alloy) containing at least one kind of element (atom) selected from the group consisting of Cu, Ag, and Zn and at least one kind of element (chalcogen) (atom) selected from the group consisting of Te, S, and Se. The high resistance layer 41 can be formed of a metal material, a rare-earth element, oxide or nitride of a mixture thereof, or a semiconductor material. In embodiment 1, the ion source layer 42 specifically contains Cu and Te and is more specifically formed of CuZnTeAlGe, and the high resistance layer 41 is formed of gadolinium (Gd) oxide ($GdO_x$). Here, Cu, Ag, and Zn are elements (atoms) which can easily move in the ion source layer 42 or the high resistance layer 41 when they are changed to cations. On the other hand, Te, S, and Se are elements (atoms) which can set the resistance value of the ion source layer 42 to be lower than the resistance value of the high resistance layer 41 when a current is made to flow in the information storage layer 40. When Cu and the like are used as an element to be changed to cations and Te and the like are used as chalcogen (atom) in the ion source layer 42, and a current is made to flow in the information storage layer 40, the resistance value of the ion source layer 42 can be set to be lower than the resistance value of the high resistance layer 41 and the part whose resistance value is greatly changed can be limited to the ion source layer 42, thereby improving the stability of the memory operation. The ion source layer 42 may have a laminated structure of two or more layers. For example, when the ion source layer includes two layers, a two-layer structure of a thin layer containing at least one kind of metal element (atom) selected from the group consisting of Cu, Ag, and Zn and a conductive or semi-conductive thin film containing at least one kind of chalcogen (atom) selected from the group consisting of Te, S, and Se can be used. The thin film close to the high resistance layer can be constructed by a thin layer containing a metal element (atom).

Alternatively, when the information storage layer 40 has a laminated structure of the high resistance layer 41 and the ion source layer 42, the high resistance layer 41 may most contain tellurium (Te) as an anion component, and the ion source layer 42 contains at least one kind of metal element as an element which can be ionized to a cation and contains at least one element (chalcogen) (atom) selected from the group consisting of tellurium (Te), sulfur (S), and selenium (Se) as an element which can be ionized to an anion. Specifically, the high resistance layer 41 can be formed of AlTe and the ion source layer 42 can be formed of CuTeZrAlGe.

In the nonvolatile memory device according to embodiment 1, when a voltage is applied across the electrode 31 and the conductive material layer 32, the metal atoms contained in the electrode 31 or the conductive material layer 32 diffuse as ions into the ion source layer 42 and the electrical characteristics such as the resistance value or the capacitance value of the ion source layer 42 vary. Accordingly, the memory function can be exhibited using the variation of the electrical characteristics. Alternatively, the metal atoms in the ions source layer 42 are ionized, and the ions diffuse into the high resistance layer 41 and are combined with electrons at the minus electrode to precipitate, or the ions diffuse into the high resistance layer 41 and stay therein. As a result, a current path containing a lot of metal atoms is formed in the high resistance layer 41 or plural defects due to the metal atoms are formed in the high resistance layer 41, whereby the resistance value of the high resistance layer 41 is lowered. At this time, the resistance value of the ion source layer 42 is originally lower than the resistance value of the high resistance layer 41 before storing information (data). Accordingly, by lowering the resistance value of the high resistance layer 41, the total resistance value of the memory device is also lowered, thereby exhibiting the memory function.

The operation of the nonvolatile memory device according to embodiment 1 will be described below in more detail.

[Writing of Information]

When a positive potential (plus potential) is applied to the conductive material layer 32 and a negative potential (minus potential) or a zero potential is applied to the electrode 31, the metal ions in the ion source layer 42 are ionized and the ions diffuse into the high resistance layer 41 and are combined with electrons at the electrode to precipitate, or the ions diffuse into the high resistance layer 41 and stay therein. As a result, a current path containing a lot of metal atoms is formed in the high resistance layer 41 or plural defects due to the metal atoms are formed in the high resistance layer 41, whereby the resistance value of the high resistance layer 41 is lowered. At this time, the resistance value of the ion source layer 42 is originally lower than the resistance value of the high resistance layer 41 before storing information (data). Accordingly. by lowering the resistance value of the high resistance layer 41, the total resistance value of the memory device is also lowered. That is, the nonvolatile memory device is turned on (changed to an electrically-connected state). At this time, the total resistance of the nonvolatile memory device is the writing resistance.

Thereafter, when the application of a voltage to the electrode 31 and the conductive material layer 32 is stopped and thus no voltage is applied to the nonvolatile memory device, the resistance value of the nonvolatile memory device is retained in the lower state. In this way, information (data) is recorded (written).

[Erasing of Information]

When a negative potential is applied to the conductive material layer 32 and a positive potential or a zero potential is applied to the electrode 31, the metal element constituting the current path formed in the high resistance layer 41 or the impurity level is ionized and the ions move in the high resistance layer 41 and returns to the ion source layer 42. As a result, the current path or defects disappear from the high resistance layer 41 and the resistance value of the high resistance layer 41 is thus raised. At this time, since the resistance value of the ion source layer 42 is originally low, the total resistance value of the nonvolatile memory device is raised with the raising of the resistance value of the high resistance layer 41. That is, the nonvolatile memory device is turned off (changed to an electrically-disconnected state). At this time, the total resistance of the nonvolatile memory device is the erasing resistance.

Thereafter, when the application of a voltage to the electrode 31 and the conductive material layer 32 is stopped and thus no voltage is applied to the nonvolatile memory device, the resistance value of the nonvolatile memory device is retained in the raised state. In this way, the recorded information (data) is erased.

By repeating these processes, the recording (writing) of information to the nonvolatile memory device and the erasing of the recorded information can be repeatedly performed.

At this time, for example, when the state in the low-resistance state) where the total resistance of the nonvolatile memory device serves as the writing resistance corresponds to the information of "1" and the state (the high-resistance state) where the total resistance of the nonvolatile memory device serves as the erasing resistance corresponds to the information of "0", the information stored in the nonvolatile memory device can be changed from "0" to "1" by applying a positive potential to the conductive material layer 32, and the information stored in the nonvolatile memory device can be changed from "1" to "0" by applying a negative potential to the conductive material layer 32.

[Reading of Information]

In order to read the written information, for example, a positive potential is applied to the conductive material layer 32 and a negative potential or a zero potential is applied to the electrode 31. Here, the value of the positive potential applied to the conductive material layer 32 is set to be lower than the value of the positive potential applied to the conductive material layer 32 at the time of writing information. Accordingly, it is possible to detect the resistance value of the nonvolatile memory device and to read information stored in the nonvolatile memory device. As long as the resistance value can be read, the application destination of the positive potential is not limited to the conductive material layer 32 but may be the electrode 31.

In this way, in embodiment 1, the recording and erasing of information are performed using the nonvolatile memory device having a simple structure in which the high resistance layer 41 and the ion source layer 42 are laminated in the first concavity 24. Accordingly, even when the nonvolatile memory device is miniaturized, it is possible to easily record and erase information. Since the resistance value of the information storage layer 40 can be retained without any supply of power, it is possible to store information for a long period of time. Since the resistance value of the information storage layer 40 does not vary and a flash operation does not have to be performed, it is possible to reduce the power consumption.

Figure 6A:
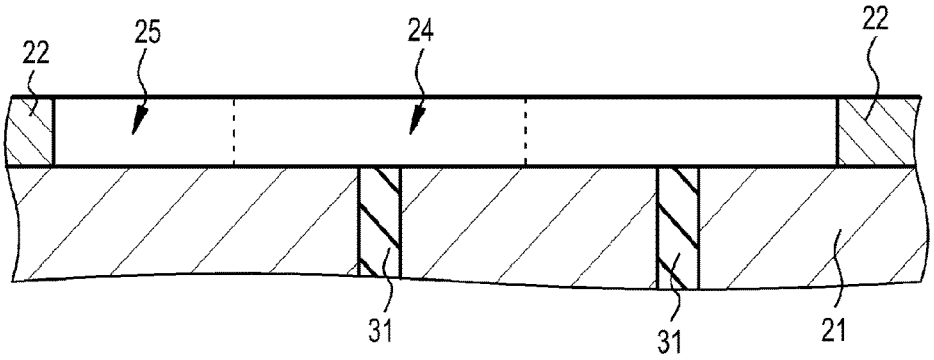
FIGS. 6A, 6B, and 6C are diagrams illustrating a method of manufacturing the nonvolatile memory device group according to embodiment 1 of the present disclosure, where
Figure 6B:
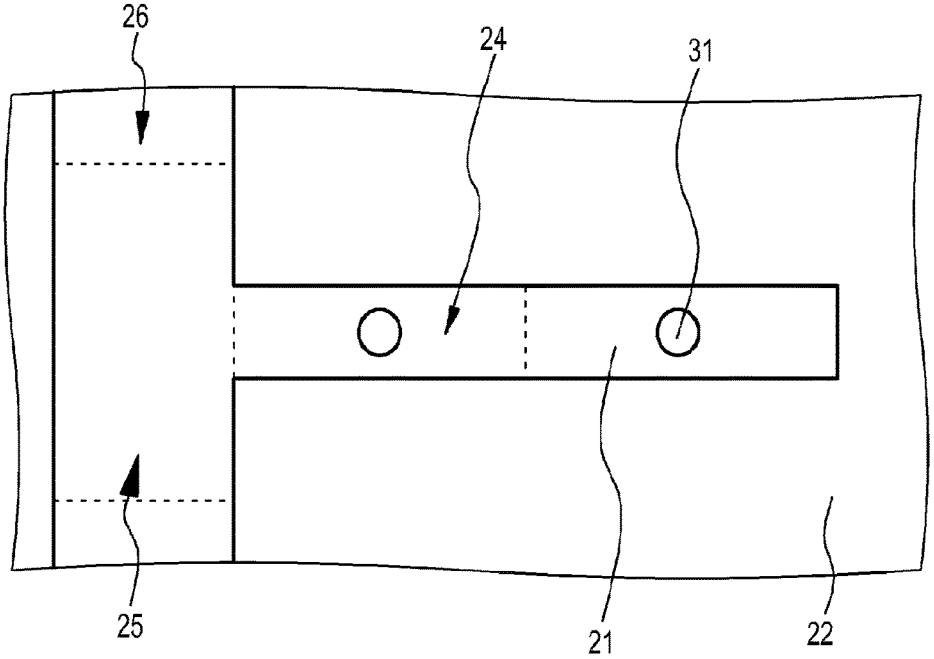
Figure 6C:
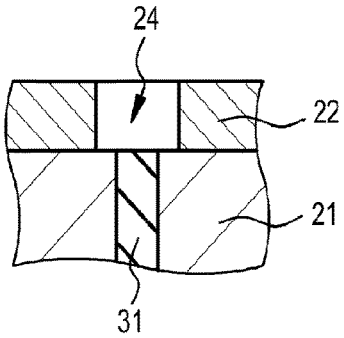
Figure 7A:
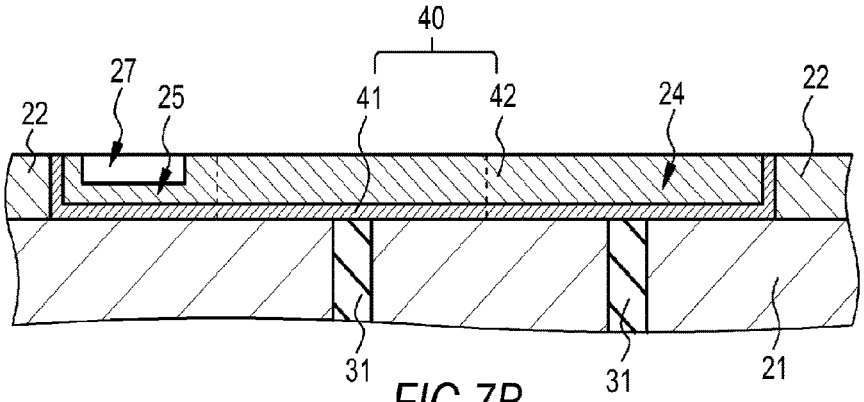
FIGS. 7A, 7B, and 7C are diagrams illustrating a method of manufacturing the nonvolatile memory device group according to embodiment 1 of the present disclosure which are subsequent to FIGS. 6A, 6B, and 6C, where
Figure 7B:
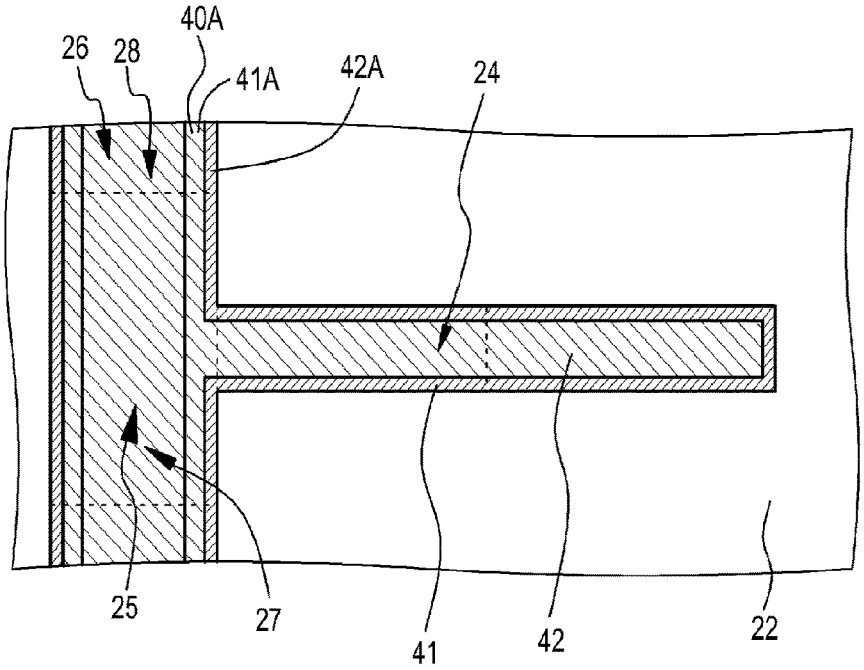
Figure 7C:
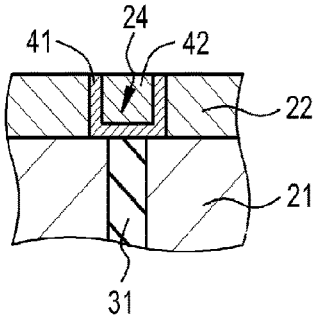

The method of manufacturing the nonvolatile memory device group according to embodiment 1 will be described below with reference to FIGS. 6A, 6B, and 6C and FIGS. 7A, 7B, and 7C. The method of manufacturing the nonvolatile memory device group according to embodiment 1 is based on a so-called damascene method. FIG. 6A and FIG. 7A are partial sectional views which are the same as the sectional view taken along arrow A-A of FIG. 1B, FIG. 6B and FIG. 7B are partial plan views which are the same as FIG. 1B, and FIG. 6C and FIG. 7C are partial sectional views which are the same as the sectional view taken along arrow C-C of FIG. 1B. In the drawings, the components (the selection transistor TR and the like) of the nonvolatile memory device located below the electrode 31 are not shown.

[Step 100]

First, plural electrodes 31 the top surface of which is flush with the top surface of the first insulating layer 21 are formed in the first insulating layer 21. Specifically, the isolation region 11 is formed in the silicon semiconductor susbtrate 10 by the use of the known methods and then the selection transistor TR including the gate oxide film 13, the gate electrode 12, and the source/drain regions 14A and 14B is formed in the part of the silicon semiconductor susbtrate 10 surrounded with the isolation region 11. Then, a lower layer 21A of the first insulating layer is formed using the CVD method, the tungsten plug 15 is formed in the part of the lower layer 21A of the first insulating layer above the source/drain region 14A, and a sense line 16 is formed on the lower layer 21A of the first insulating layer. Thereafter, an upper layer 21B of the first insulating layer is formed on the entire surface using the CVD method, and the electrode 31 formed of tungsten plug is formed in the part of the first insulating layer 21 above the source/drain region 14B. In this way, the selection transistor TR covered with the first insulating layer 21 formed of $SiO_2$ can be acquired (see FIG. 2).

[Step 110]

Thereafter, the second insulating layer 22 formed of $SiO_2$ is formed on the first insulating layer 21 using the CVD method. The first concavity 24 in which the electrode is exposed from the bottom surface thereof and the second concavity 25 communicating with the first concavity 24 and having a width larger than that of the first concavity 24 are formed in the second insulating layer 22 using a photolithography technique and an etching technique. In embodiment 1, the concavity connection portion 26 connecting the second concavities 25 of the neighboring nonvolatile memory device groups is also formed in the second insulating layer 22. In this way, the state shown in FIGS. 6A, 6B, and 6C can be achieved. By oxidizing the top surface of the electrode 31 with a very small thickness, the damage caused in the top surface of the electrode 31 at the time of forming the first concavity 24 may be recovered, for example, using a heating process at 400° C.

[Step 120]

The information storage layer 40 is formed on the top surface of the second insulating layer 22 and the side walls and the bottom surfaces of the first concavity 24 and the second concavity 25. In embodiment 1, the information storage layer extension 40A is also formed on the side walls and the bottom surface of the concavity connecting portion 26. Specifically, the high resistance layer 41 formed of gadolinium (Gd) oxide with a thickness of 3 nm and the ion source layer 42 containing Cu and Te with a thickness of 10 nm are sequentially formed using a sputtering method. In this way, the state shown in FIGS. 7A, 7B, and 7C can be achieved. The first concavity 24 has a width smaller than that of the second concavity 25 and the concavity connecting portion 26. By appropriately designing the depths and widths of the first concavity 24, the second concavity 25, and the concavity connecting portion 26, the first concavity 24 is buried in the information storage layer 40, the information storage layer 40 and the information storage layer extension 40A are formed on the side walls and the bottom surfaces of the second concavity 25 and the concavity connecting portion 26, the space 27 surrounded with the information storage layer 40 is formed in the second concavity 25, and the space 28 surrounded with the information storage layer extension 40A is formed in the concavity connecting portion 26.

[Step 130]

Thereafter, the conductive material layer 32 formed of tungsten (W) and titanium (Ti) are formed on the entire surface using the sputtering method. At this time, the conductive material layer extension 32A is also formed.

[Step 140]

Then, the conductive material layer 32 and the information storage layer 40 (along with the conductive material layer extension 32A and the information storage layer extension 40A) on the top surface of the second insulating layer 22 are removed, for example, using a chemical/mechanical polishing method (CMP method). In this way, the first concavity 24 having the information storage layer 40 buried therein and the second concavity 25 having the information storage layer 40 and the conductive material layer 32 buried therein are acquired on the bass of the damascene method (see FIGS. 1A, 1B, and 1C). The concavity connecting portion 26 having the information storage layer extension 40A and the conductive material layer extension 32A buried therein can be also acquired. The wiring 33 formed of the conductive material layer 32 and the conductive material layer extension 32A filled in the second concavity 25 and the concavity connecting portion 26 can be achieved.

In embodiment 1, the nonvolatile memory device group has a so-called damascene structure. Accordingly, since it is not necessary to pattern the information storage layer using an etching method, it is possible to avoid the damage on the information storage layer due to the patterning. Since the devide structure is formed in the concavity, it is possible to avoid the peeling of a film and to simplify the manufacturing processes. Since the bit line 33 is not formed to come in direct contact with the nonvolatile memory device, the nonvolatile memory device is not adversely affected by the formation of the bit line 33. Since the width of the nonvolatile memory device is small, it is possible to raise the degree of freedom in layout.

Embodiment 2

Embodiment 2 is a modification of embodiment 1. In embodiment 2, the nonvolatile memory device is constructed by a phase change memory device (PRAM). That is, in embodiment 2, the resistance change layer is formed of a chalcogenide material. The phase change material constituting the information storage layer (resistance change layer) as a memory part varies in electrical resistance between an amorphous state and a crystallized state by several digits, thereby causing the nonvolatile memory device to work. Specifically, when a pulse-like large current (for example, 200 μA for 20 nsec) is caused to flow in the memory part for a short time and the resultant is rapidly cooled, the phase change material constituting the resistance change layer is changed to the amorphous state and exhibits high resistance. On the other hand, when a pulse-like small current (for example, 100 μA for 100 nsec) is caused to flow in the resistance change layer for a relatively long time and the resultant is slowly cooled, the phase change material constituting the resistance change layer is changed to the crystallized state and exhibits low resistance.

The resistance change layer may be formed of a chalcogenide material including a compound of a metal such as GeSbTe, ZnSe, and GaSnTe and Se or Te. Alternatively, the resistance change layer may be formed of a material having a colossal magnetoresistive effect (CER effect), such as ternary perovskite type transition metal oxides (such as $PrCaMnO_3$ and $SrTiO_3$) and binary transition metal oxides (such as CiO, NiO, CuO, $TiO_2$, and $Fe_3O_4$).

For example, when the resistance change layer is formed of $TiO_2$ and a forming process of first applying a large voltage to the nonvolatile memory device is performed, plural current paths (filament) having low resistance are locally formed in the resistance change layer. In the process of "reset", the anode (the side to which a plus voltage is applied) of the filament is oxidized by the applied voltage and the resistance value is raised to the high-resistance state. As a result, the total resistance value of the nonvolatile memory device is raised. That is, the nonvolatile memory device is turned off (changed to the electrically-disconnected state). At this time, the total resistance of the nonvolatile memory device is the erasing resistance. In the process of "set", the anode of the filament is reduced by Joule heat and the resistance value thereof is lowered again to the low-resistance state. As a result, the total resistance value of the nonvolatile memory device is lowered. That is, the nonvolatile memory device is turned on (changed to the electrically-connected state). At this time, the total resistance of the nonvolatile memory device is the writing resistance. By repeating these processes, the recording (writing) of information to the nonvolatile memory device and the erasing of the recorded information can be repeatedly performed.

Embodiment 3

Figure 4A:
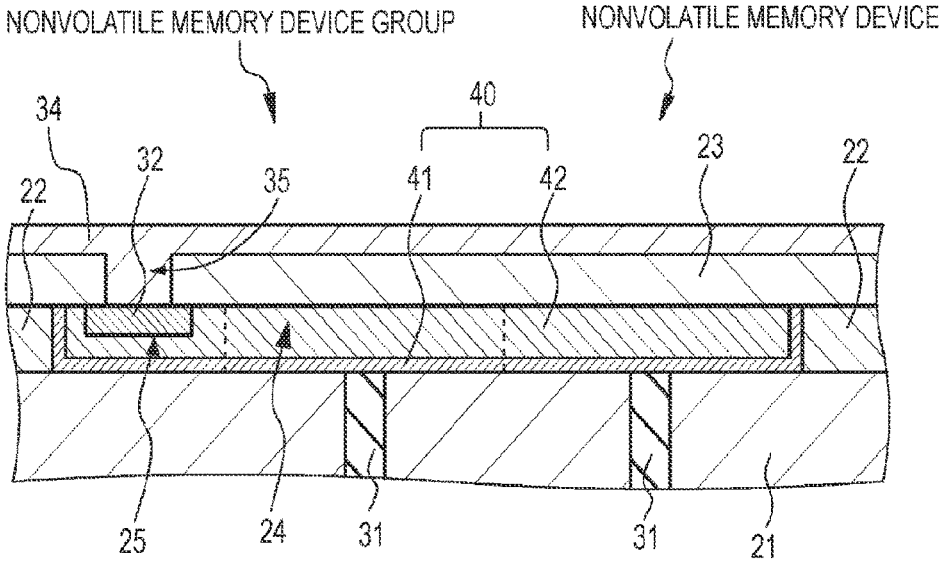
FIGS. 4A and 4B area schematic partial sectional view and a partial plan view of a nonvolatile memory device group according to embodiment 3 of the present disclosure, respectively.
Figure 4B:
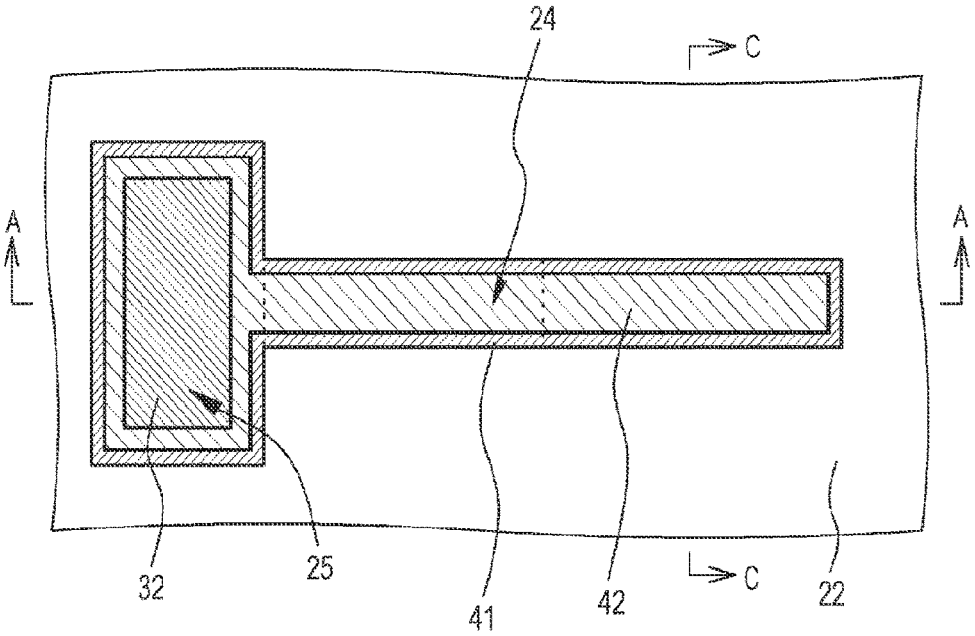

Embodiment 3 is a modification of embodiment 1. The schematic partial sectional view and the partial plan view of the nonvolatile memory device group according to embodiment 3 are shown in FIGS. 4A and 4B, respectively. The schematic partial sectional view shown in FIG. 4A is a partial sectional view taken along arrow A-A of FIG. 4B and the schematic partial sectional view taken along arrow C-C of FIG. 4B is the same as shown in FIG. 1C. In the partial plan view of FIG. 4B, the third insulating layer, the contact plug, and the wiring are removed and the information storage layer 40 and the conductive material layer 32 are shown. The schematic partial sectional view of a nonvolatile memory device constituting the nonvolatile memory device group according to embodiment 3 is the same as shown in FIG. 2 and the conceptual diagram and the equivalent circuit diagram of the nonvolatile memory device are the same as shown in FIGS. 3A and 3B.

In Embodiment 3, a third insulating layer 23 is formed on the entire surface and a wiring 34 connected to the conductive material layer 32 via a contact plug 35 is formed on the third insulating layer 23.

The method of manufacturing the nonvolatile memory device group according to embodiment 3 will be described below.

[Step 300]

First, steps 100 to 140 of embodiment 1 are performed. However, unlike embodiment 1, it is not necessary to form the concavity connecting portion 26, the conductive material layer extension 32A, and the information storage layer extension 40A. In this way, the structure shown in FIG. 4B can be achieved.

[Step 310]

The third insulating layer 23 formed of $SiO_2$ is formed on the entire surface using the CVD method. Thereafter, an opening is formed in the third insulating layer 23 above the conductive material layer 32 using the photolithography technique and the etching technique, a wiring material layer is formed on the entire surface including the opening using the sputtering method, and the wiring 34 connected to the conductive material layer 32 via the contact plug 35 is formed on the third insulating layer 23 by patterning the wiring material layer using the photolithography technique and the etching technique.

In embodiment 3, since the contact plug 35 is formed on the conductive material layer 32 in this way, it is possible to prevent the protrusion of the contact plug 35 and to lower the contact resistance.

Embodiment 4

Figure 5A:
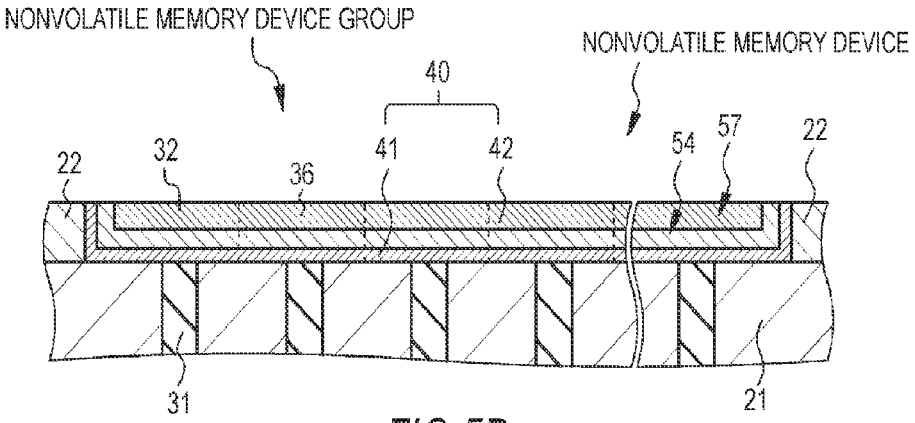
FIGS. 5A, 5B, and 5C are a schematic partial sectional view, a partial plan view, and a schematic partial sectional view of a nonvolatile memory device group according to embodiment 4 of the present disclosure, respectively.
Figure 5B:
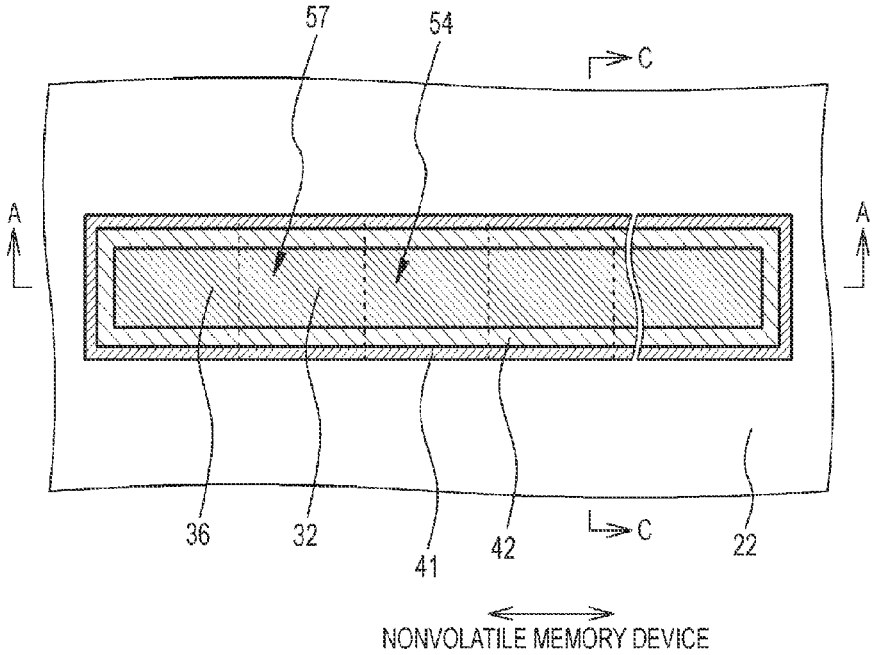
Figure 5C:
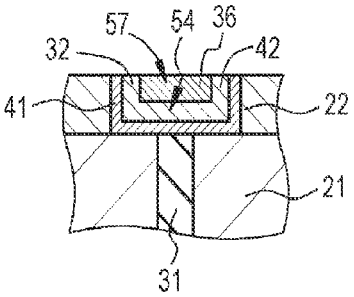

Embodiment 4 provides the nonvolatile memory device group and the manufacturing method thereof according to embodiment 2 of the present disclosure and the nonvolatile memory device and the manufacturing method thereof according to the embodiment of the present disclosure. The schematic partial sectional view, the partial plan view, and the schematic partial sectional view of the nonvolatile memory device group according to embodiment 4 are shown in FIGS. 5A, 5B, and 5C, respectively. The schematic partial sectional view shown in FIG. 5A is a partial sectional view taken along arrow A-A of FIG. 5B and the schematic partial sectional view shown in FIG. 5C is a partial sectional view taken along arrow C-C of FIG. 5B. The schematic partial sectional view of a nonvolatile memory device constituting the nonvolatile memory device group according to embodiment 4 is the same as shown in FIG. 2 and the conceptual diagram and the equivalent circuit diagram of the nonvolatile memory device are the same as shown in FIGS. 3A and 3B.

The nonvolatile memory device group according to embodiment 4 includes (A) a first insulating layer 21, (B) a second insulating layer 22 that has a concavity 54 and that is disposed on the first insulating layer 21, (C) plural electrodes (lower electrodes) 31 that are disposed in the first insulating layer 21 and the top surface of which is exposed from the bottom surface of the concavity 54, (D) an information storage layer 40 that is formed on the side wall and the bottom surface of the concavity 54, and (E) a wiring 36 including a conductive material layer 32 that is filled in a space 57 surrounded with the information storage layer 40 in the concavity 54.

In embodiment 4, N (for example, N=128) electrodes 31 are provided, a nonvolatile memory device is constructed by the electrode 31, the information storage layer 40, and the conductive material layer 32, and N nonvolatile memory devices constitute the nonvolatile memory device group. In the N nonvolatile memory devices, the information storage layer 40 and the conductive material layer 32 are common.

The nonvolatile memory device according to embodiment 4 includes (A) a first insulating layer 21, (B) a second insulating layer 22 that has a concavity 54 and that is disposed on the first insulating layer 21, (C) an electrode 31 that is disposed in the first insulating layer 21 and the top surface of which is exposed from the bottom surface of the concavity 54, (D) an information storage layer 40 that is formed on the side wall and the bottom surface of the concavity 54, and (E) a conductive material layer 32 that is filled in a space 57 surrounded with the information storage layer 40 in the concavity 54.

Since the constituent components of the nonvolatile memory device group or the nonvolatile memory device according to embodiment 4 are substantially the same as the constituent components of the nonvolatile memory device group and the nonvolatile memory device according embodiment 1, detailed description thereof will not be repeated.

Figure 8A:
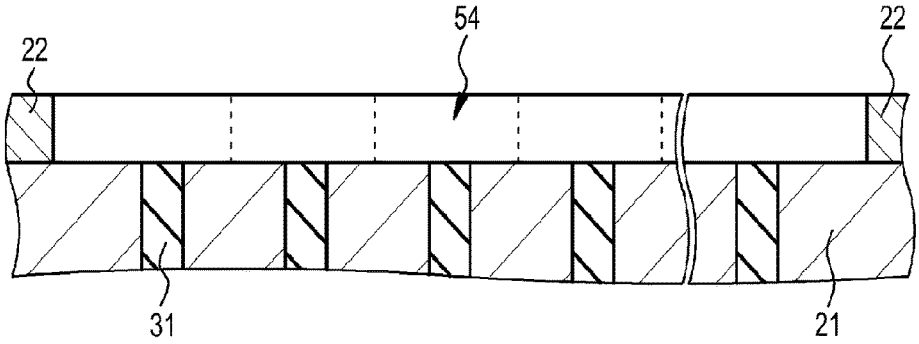
FIGS. 8A, 8B, and 8C are diagrams illustrating a method of manufacturing the nonvolatile memory device group according to embodiment 4 of the present disclosure, where
Figure 8B:
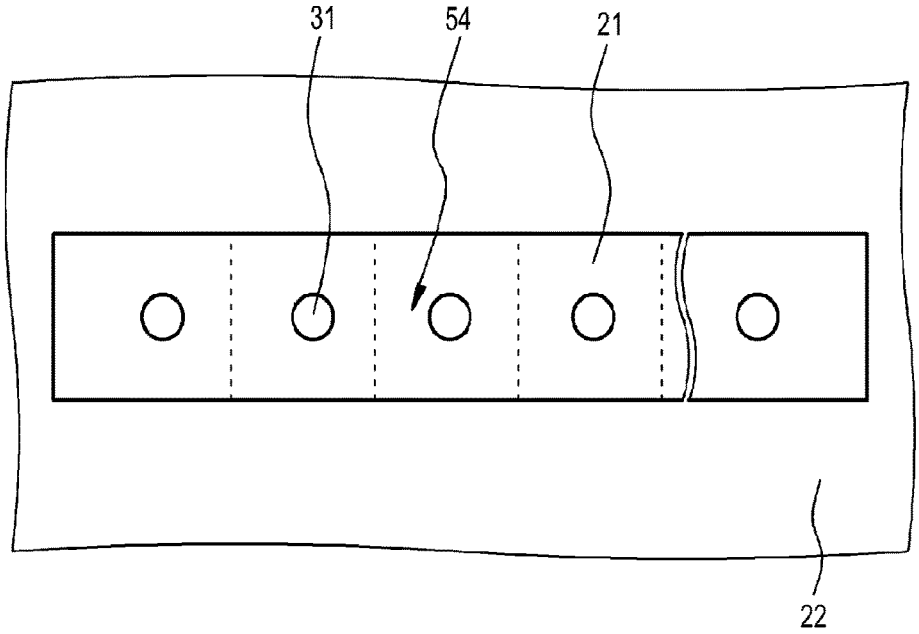
Figure 8C:
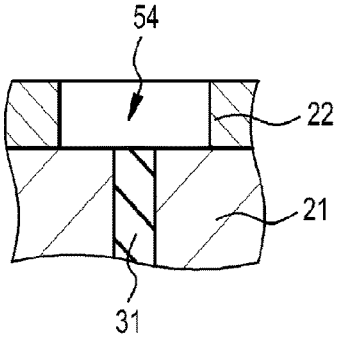
Figure 9A:
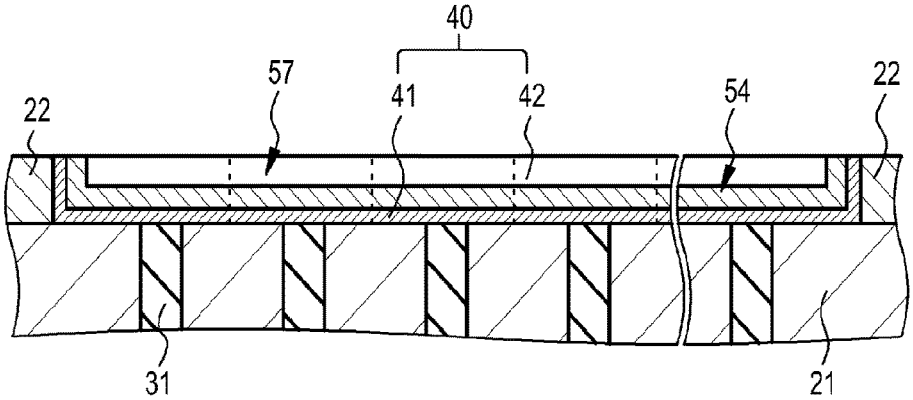
FIGS. 9A, 9B, and 9C are diagrams illustrating a method of manufacturing the nonvolatile memory device group according to embodiment 4 of the present disclosure which are subsequent to FIGS. 8A, 8B, and 8C, where
Figure 9B:
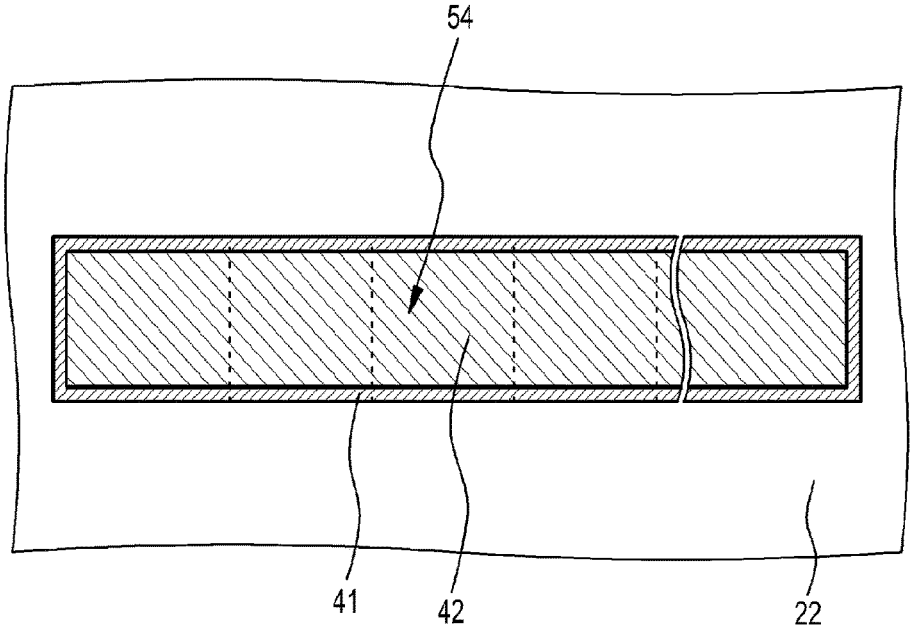
Figure 9C:
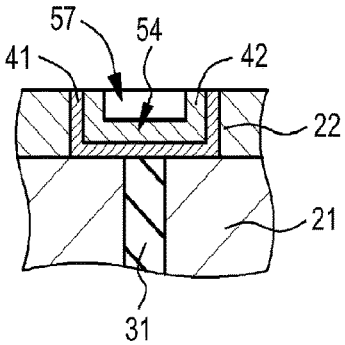

The method of manufacturing the nonvolatile memory device group and the nonvolatile memory device according to embodiment 4 will be described below with reference to FIGS. 8A, 8B, and 8C and FIGS. 9A, 9B, and 9C. The method of manufacturing the nonvolatile memory device group according to embodiment 4 is based on a so-called damascene method. FIG. 8A and FIG. 9A are partial sectional views which are the same as the sectional view taken along arrow A-A of FIG. 5B, FIG. 8B and FIG. 9B are partial plan views which are the same as FIG. 5B, and FIG. 8C and FIG. 9C are partial sectional views which are the same as the sectional view taken along arrow C-C of FIG. 5B. In the drawings, the components (the selection transistor TR and the like) of the nonvolatile memory device located below the electrode 31 are not shown.

[Step 400]

First, substantially similarly to step 100 in embodiment 1, the (plural) electrodes 31 the top surface of which is flush with the top surface of the first insulating layer 21 are formed in the first insulating layer 21.

[Step 410]

Thereafter, substantially similarly to step 110 in embodiment 1, the second insulating layer 22 formed of SiN is formed on the first insulating layer 21 using the CVD method and the concavity 54 in which the electrode 31 is exposed from the bottom surface thereof is formed in the second insulating layer 22. In this way, the state shown in FIGS. 8A, 8B, and 8C can be achieved.

[Step 420]

Substantially similarly to step 120 in embodiment 1, the information storage layer 40 is formed on the top surface of the second insulating layer 22 and the side wall and the bottom surface of the concavity 54. In this way, the state shown in FIGS. 9A, 9B, and 9C can be achieved. By appropriately designing the depth and width of the concavity 54, the information storage layer 40 is formed on the side wall and the bottom surface of the concavity 54 and the space 57 surrounded with the information storage layer 40 is formed in the concavity 54.

[Step 430]

Thereafter, substantially similarly to step 130 in embodiment 1, the conductive material layer 32 is formed on the entire surface using the sputtering method.

[Step 440]

Then substantially similarly to step 140 in embodiment 1, The conductive material layer 32 and the information storage layer 40 on the top surface of the second insulating layer 22 are removed, for example, using the chemical/mechanical polishing method (CMP method). In this way, the concavity 54 having the information storage layer 40 and the conductive material layer 32 buried therein can be acquires using the damascene method (see FIGS. 5A, 5B, and 5C). it is possible to acquire the conductive material layer 32 filled in the space 57 surrounded with the concavity 54 and the information storage layer 40 and to acquire the wiring 36 including the conductive material layer 32.

In embodiment 4, the nonvolatile memory device group has a so-called damascene structure. Accordingly, since it is not necessary to pattern the information storage layer using an etching method, it is possible to avoid the damage on the information storage layer due to the patterning. Since the device structure is formed in the concavity, it is possible to avoid the peeling of a film. In addition, it is possible to simplify the manufacturing processes.

In some cases, similarly to embodiment 3, the third insulating layer may be formed on the entire surface and the wiring connected to the conductive material layer 32 via the contact plug may be further formed on the third insulating layer. In this case, a connecting portion having the same configuration and structure as the nonvolatile memory device except that the electrode 31 is not provided may be disposed at an end of the nonvolatile memory device group and a contact plug may be disposed on the connection portion. In this way, when the contact plug is formed on the conductive material layer, it is possible to prevent the protrusion of the contact plug 35 and to lower the contact resistance.

While the present disclosure has been described with reference to the preferable examples, the present disclosure is not limited to the examples. The configuration and structure of the nonvolatile memory device group and the nonvolatile memory device, various laminated structures, and the used materials, which are described in the examples, are only examples and can be modified appropriately. The information storage layer of the nonvolatile memory device may be formed by a laminated structure in which a first magnetic material layer, a tunnel insulating film, and a second magnetic material layer are sequentially stacked and may store information by the variation in electrical resistance due to its magnetization reversal state.

The present disclosure contains subject matter related to that disclosed in Japanese Priority Patent Application JP 2010-230170 filed in the Japan Patent Office on Oct. 13, 2010, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A nonvolatile memory device group comprising:

(A) a first insulating layer;

(B) a second insulating layer that has a first concavity and a second concavity communicating with the first concavity and having a width larger than that of the first concavity and that is disposed on the first insulating layer;

(C) a plurality of electrodes that are disposed in the first insulating layer [and the], *each electrode having a* top surface [of] which is exposed [from the] *at a* bottom surface of the first concavity;

(D) an information storage layer that is formed on [the] side walls and [the] bottom surfaces of the first concavity and the second concavity; and (E) a conductive material layer that is filled in a space surrounded [with] *by* the information storage layer in the second concavity.

2. The non-volatile memory device group according to claim 1, wherein:

the number of electrodes is N with N≥2;

a *plurality of* nonvolatile memory [device is] *devices are* formed by the electrodes, the information storage layer, and the conductive material layer; and the nonvolatile memory device group includes N nonvolatile memory devices.

3. The non-volatile memory device group according to claim 1, wherein:

a third insulating layer is [formed on an entire surface] *over the second insulating layer;* and a wiring connected to the conductive material layer via a contact plug is formed on the third insulating layer.

4. [The] *A* non-volatile memory device group *device comprising a plurality of nonvolatile memory device groups each* according to claim 1, wherein:

a concavity connecting portion connecting the second concavities of neighboring nonvolatile memory device groups to each other is disposed in the second insulating layer;

an information storage layer extension is formed on [the] *a* side wall and [the] *a* bottom surface of the concavity connecting portion;

a space surrounded by the information storage layer extension in the concavity connection portion is filled with a conductive material layer extension; and a wiring is formed by the conductive material layer and the conductive material layer extension filled in the second concavity and the concavity connecting portion.

5. The non-volatile memory device group according to claim 1, wherein the information storage layer includes a resistance change layer that stores information by a change in electrical resistance.

6. The non-volatile memory device group according to claim 5, wherein the resistance change layer has a laminated structure of a high resistance layer and an ion source layer.

7. The non-volatile memory device group according to claim 6, wherein*:* the ion source layer contains at least one kind of element selected from the group consisting of tellurium, sulfur, and selenium and at least one kind of element selected from the group consisting of copper, zirconium, and aluminum*;* and the resistance of the high resistance layer is lowered by causing the at least one kind of element selected from the group consisting of copper, zirconium, and aluminum to diffuse into the high resistance layer when a predetermined voltage is applied to the corresponding *nonvolatile* memory device.

[8. A nonvolatile memory device group comprising:

(A) a first insulating layer;

(B) a second insulating layer having a concavity and that is disposed on the first insulating layer;

(C) a plurality of electrodes that are disposed in the first insulating layer and the top surface of which is exposed from the bottom surface of the concavity;

(D) an information storage layer that is formed on the side wall and the bottom surface of the concavity; and (E) a conductive material layer that is fully filled in a space surrounded with the information storage layer in the concavity.]

[9. The non-volatile memory device group according to claim 8, wherein:

the number of electrodes is N with N≥2;

a nonvolatile memory device is formed by the electrodes, the information storage layer, and the conductive material layer; and the nonvolatile memory device group includes N nonvolatile memory devices.]

[10. A nonvolatile memory device comprising:

(A) a first insulating layer;

(B) a second insulating layer having a concavity and that is disposed on the first insulating layer;

(C) an electrode that is disposed in the first insulating layer and the top surface of which is exposed from the bottom surface of the concavity;

(D) an information storage layer that is formed on the side wall and the bottom surface of the concavity; and (E) a conductive material layer that is fully filled in a space surrounded with the information storage layer in the concavity.]

[11. The non-volatile memory device according to claim 10, wherein the information storage layer includes a resistance change layer that stores information by a change in electrical resistance.]

[12. The non-volatile memory device according to claim 11, wherein the resistance change layer has a laminated structure of a high resistance layer and an ion source layer.]

13. A method of manufacturing a nonvolatile memory device group, comprising:

(a) forming *in a first insulating layer* a plurality of electrodes, [the] *each having a* top surface [of] which is flush with [the] *a* top surface of [a] *the* first insulating layer[, in the first insulating layer];

(b) forming a second insulating layer on the first insulating layer, and then forming *in the second insulating layer* a first concavity exposing the electrodes from [the] *a* bottom surface thereof and a second concavity communicating with the first concavity and having a width larger than that of the first concavity [in the second insulating layer];

(c) forming an information storage layer on the top surface of the second insulating layer and [the] side walls and [the] bottom surfaces of the first concavity and the second concavity;

(d) forming a conductive material layer on [an entire surface of] the information storage layer; and (e) removing the conductive material layer and the information storage layer on the top surface of the second insulating layer to acquire the first concavity having the information storage layer buried therein and the second concavity having the information storage layer and the conductive material layer buried therein.

14. The method according to claim 13, wherein:

the number of electrodes is N with N≥2;

a *plurality of* nonvolatile memory [device is] *devices are* formed by the electrodes, the information storage layer, and the conductive material layer; and the nonvolatile memory device group includes N nonvolatile memory devices.

15. The method according to claim 13, further comprising:

forming a third insulating layer on [an entire surface subsequently to] *on the second insulating layer after step* (e); and forming a wiring connected to the conductive material layer via a contact plug on the third insulating layer.

16. The method according to claim 13, wherein:

a concavity connecting portion that connects the second concavities in neighboring nonvolatile memory device groups to each other is formed in the second insulating layer in (b);

an information storage layer extension is formed on the side wall and the bottom surface of the concavity connecting portion in (c);

the conductive material layer and the information storage layer on the top surface of the second insulating layer are removed in (e) to acquire the first concavity having the information storage layer buried therein, the second concavity having the information storage layer and the conductive material layer buried therein, and the concavity connecting portion having the information storage layer extension and the conductive material layer extension buried therein; and a wiring is formed by the conductive material layer and the conductive material layer extension filled in the second concavity and the concavity connecting portion.

[17. A method of manufacturing a nonvolatile memory device group, comprising:

(a) forming a plurality of electrodes, the top surface of which is flush with the top surface of a first insulating layer, in the first insulating layer;

(b) forming a second insulating layer on the first insulating layer and then forming a concavity exposing the electrodes from the bottom surface thereof in the second insulating layer;

(c) forming an information storage layer on the top surface of the second insulating layer and the side wall and the bottom surface of the concavity;

(d) forming a conductive material layer on an entire surface of the information storage layer; and (e) removing the conductive material layer and the information storage layer on the top surface of the second insulating layer to acquire a wiring formed by the conductive material layer fully filled in a space surrounded with the information storage layer in the concavity.]

[18. The method according to claim 17, wherein:

the number of electrodes is N with N≥2;

a nonvolatile memory device is formed by the electrodes, the information storage layer, and the wiring; and the nonvolatile memory device group includes N nonvolatile memory devices.]

[19. A method of manufacturing a nonvolatile memory device, comprising:

(a) forming an electrode, the top surface of which is flush with the top surface of a first insulating layer, in the first insulating layer;

(b) forming a second insulating layer on the first insulating layer and then forming a concavity exposing the electrode from the bottom surface thereof in the second insulating layer;

(c) forming an information storage layer on the top surface of the second insulating layer and the side wall and the bottom surface of the concavity;

(d) forming a conductive material layer on an entire surface of the information storage layer; and (e) removing the conductive material layer and the information storage layer on the top surface of the second insulating layer to acquire the conductive material layer fully filled in a space surrounded with the information storage layer in the concavity.]

*20. The non-volatile memory device group according to claim 1, wherein:*

*the number of electrodes is N with N≥2;*

*a plurality of nonvolatile memory devices are formed by the electrodes, the information storage layer, and the conductive material layer;*

*the nonvolatile memory device group includes N nonvolatile memory devices;*

*a third insulating layer is over the second insulating layer; and*

*a wiring connected to the conductive material layer via a contact plug is formed on the third insulating layer.*

*21. The non-volatile memory device group according to claim 1, wherein:*

*a third insulating layer is over the second insulating layer;*

*a wiring connected to the conductive material layer via a contact plug is formed on the third insulating layer; and*

*the information storage layer includes a resistance change layer that stores information by a change in electrical resistance.*

*22. The non-volatile memory device group according to claim 1, wherein:*

*the number of electrodes is N with N≥2;*

*a plurality of nonvolatile memory devices are formed by the electrodes, the information storage layer, and the conductive material layer;*

*the nonvolatile memory device group includes N nonvolatile memory devices;*

*a third insulating layer is over the second insulating layer;*

*a wiring connected to the conductive material layer via a contact plug is formed on the third insulating layer; and*

*the information storage layer includes a resistance change layer that stores information by a change in electrical resistance.*

* * * * *